United States Patent [19]

Wallace

[11] Patent Number: 4,757,759

[45] Date of Patent: Jul. 19, 1988

[54] MULTILAYER CERAMIC BAR PRINTING AND ASSEMBLING APPARATUS

[75] Inventor: Clarence L. Wallace, Del Mar, Calif.

[73] Assignee: Tam Ceramics, Inc., Niagara Falls, N.Y.

[21] Appl. No.: 836,409

[22] Filed: Mar. 5, 1986

[51] Int. Cl.$^4$ ............................................. B41F 17/00
[52] U.S. Cl. ........................................ 101/35; 101/126
[58] Field of Search .................. 101/126, 35; 414/101, 414/904; 156/563, 299; 29/25.41, 25.42

[56] References Cited

U.S. PATENT DOCUMENTS

| | | | |
|---|---|---|---|
| 2,655,271 | 10/1953 | Cole et al. | 414/101 X |
| 3,464,351 | 9/1969 | De Hart et al. | 101/126 |
| 3,486,441 | 12/1969 | Hillman et al. | 101/126 X |
| 3,598,043 | 8/1971 | Schuff | 101/40 |
| 3,638,564 | 2/1972 | Prange et al. | 101/126 X |
| 3,957,371 | 5/1976 | Rich | 101/126 X |
| 4,353,957 | 10/1982 | Rutt et al. | 428/292 |

FOREIGN PATENT DOCUMENTS 58866  5/1981  Japan .................................. 101/126

*Primary Examiner*—Clifford D. Crowder
*Attorney, Agent, or Firm*—Kenyon & Kenyon

[57] ABSTRACT

Printing device for the automated maufacture of multilayer capacitors and the like including an octagonal drum serving as a transport mechanism for rotating ceramic sheet around a horizontal rotational axis to apparatus for performing the various manufacturing process phases located at cardinal points around such axis, including apparatus for screening and stacking the printed sheets.

7 Claims, 11 Drawing Sheets

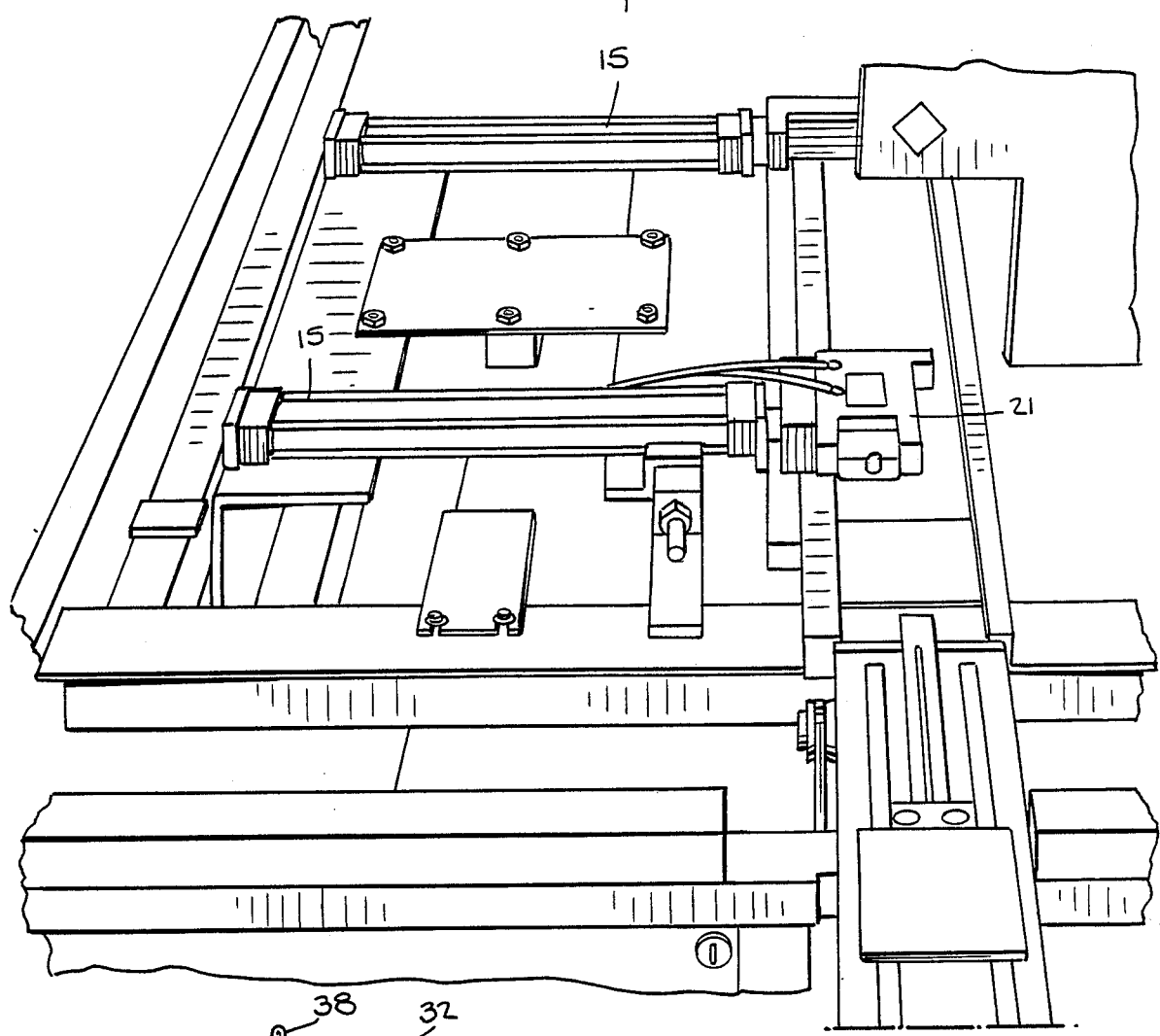
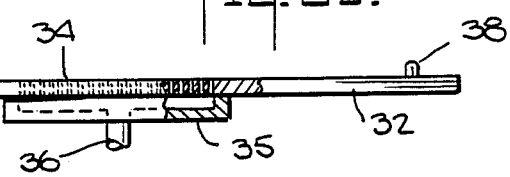
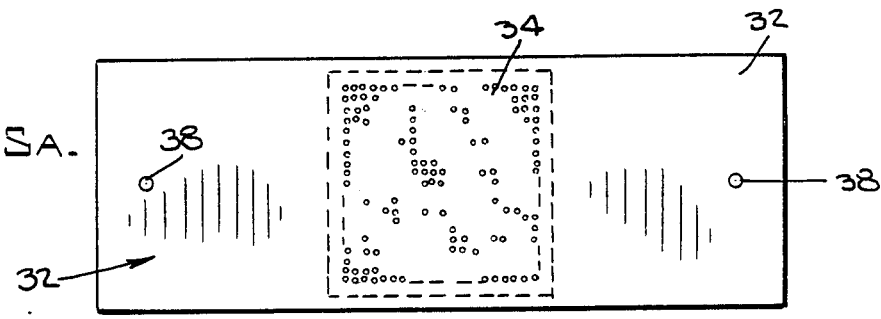

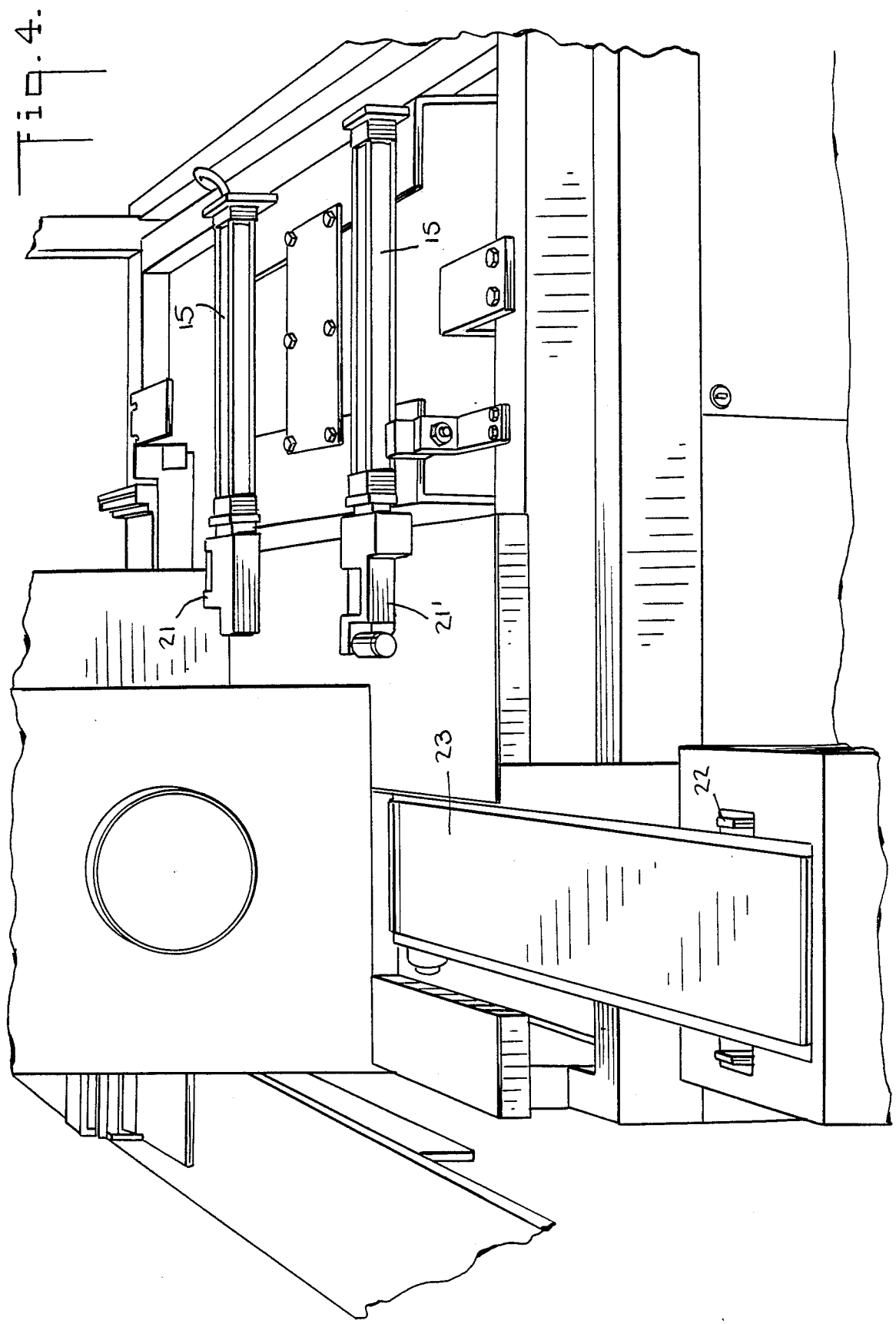

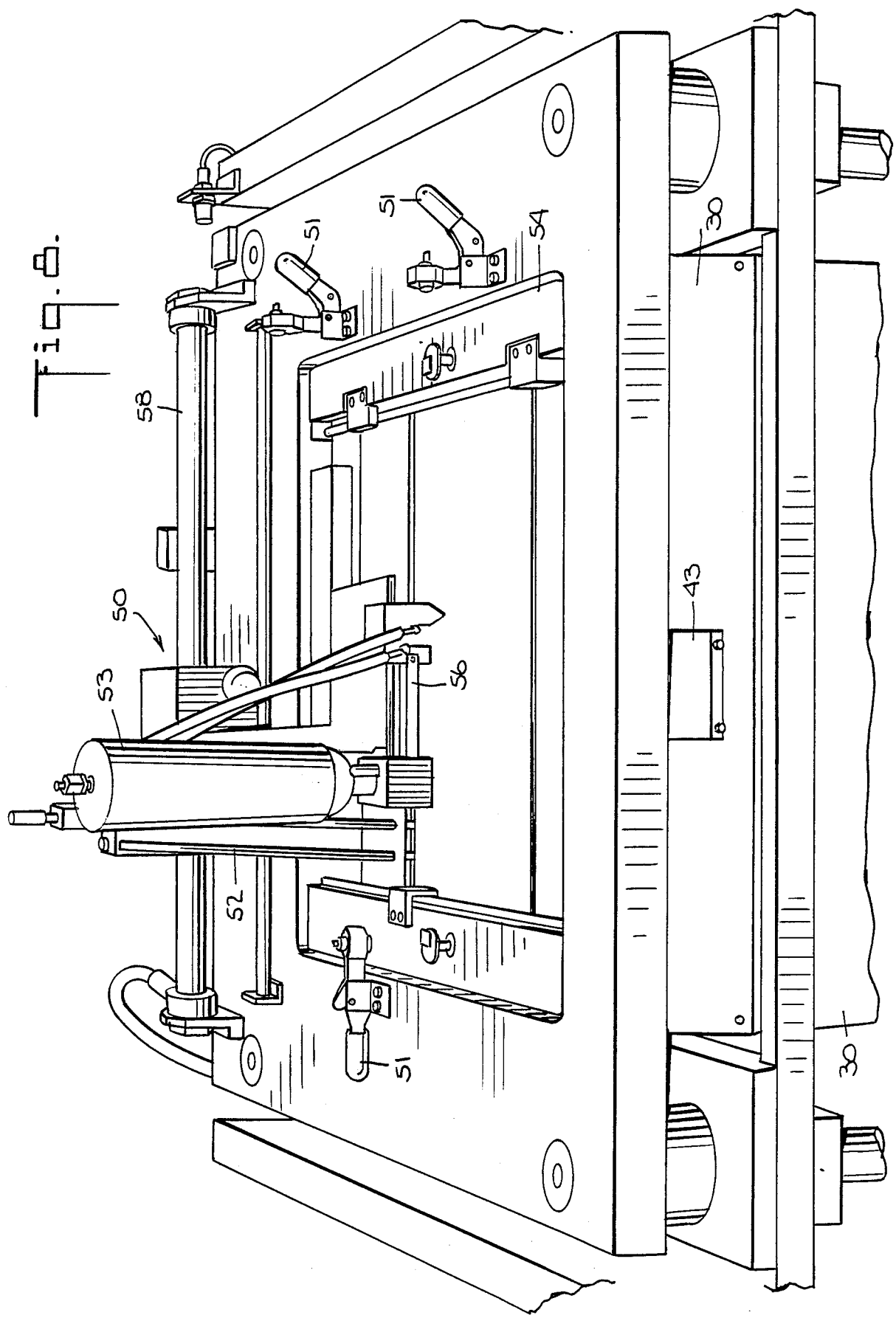

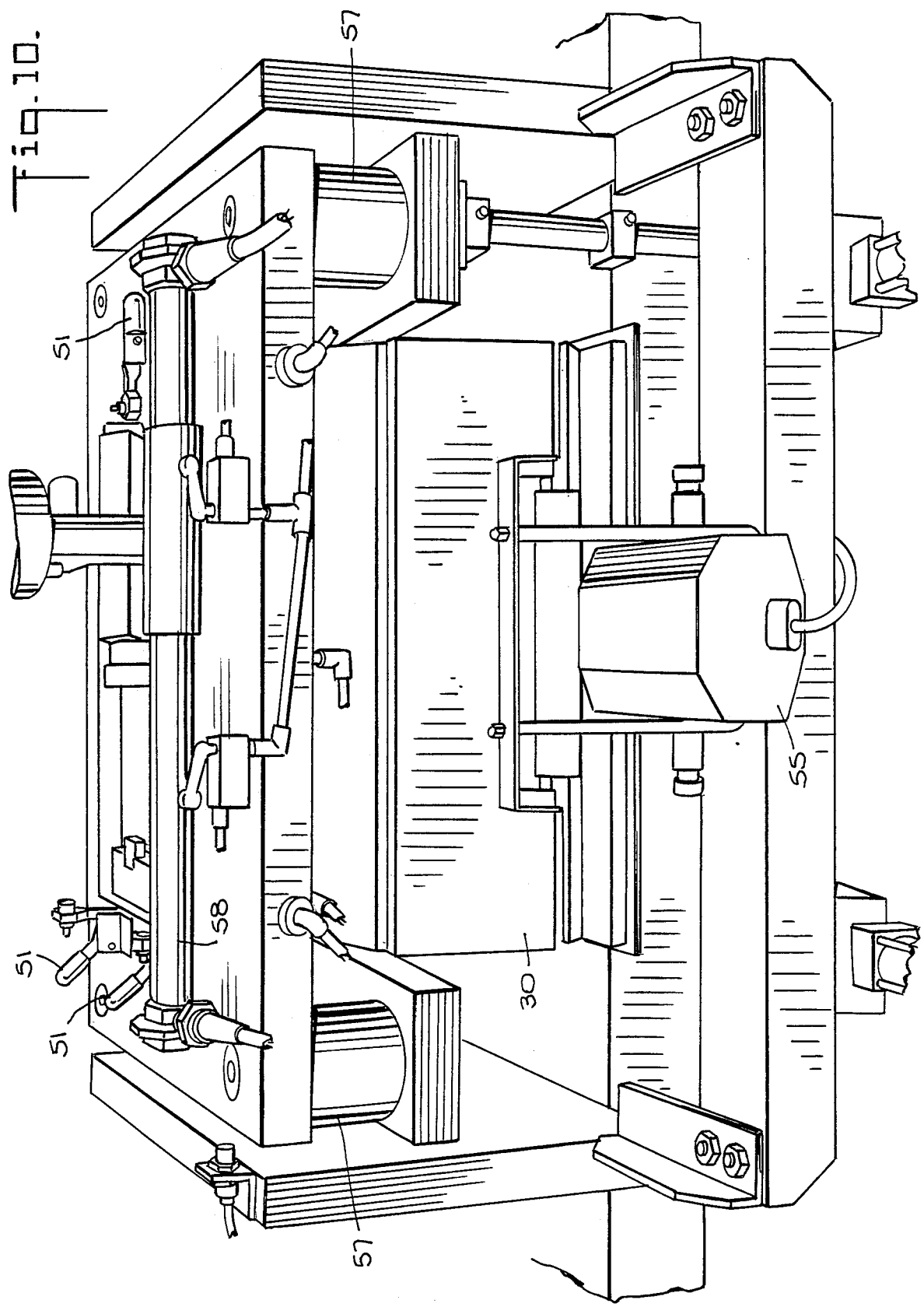

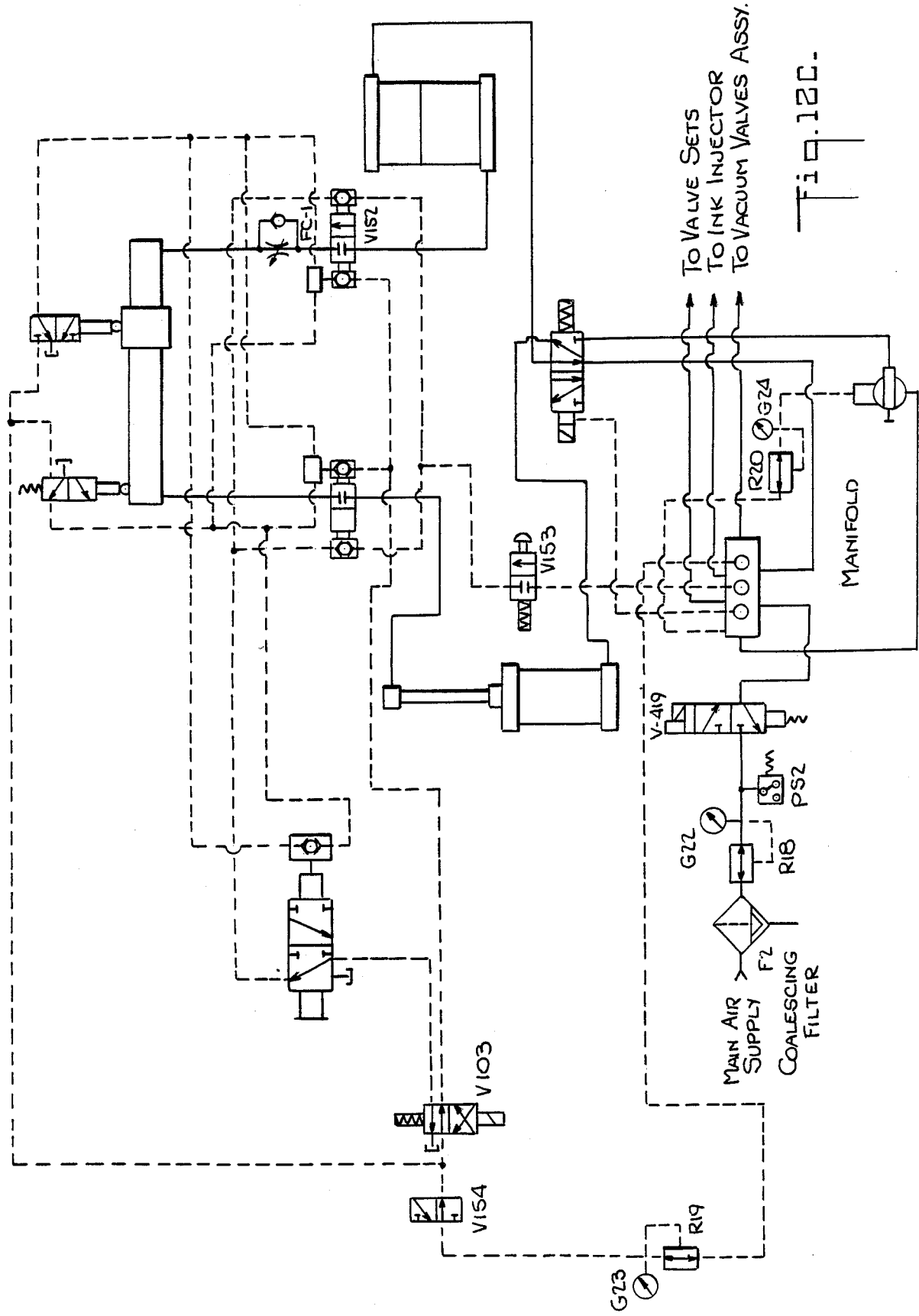

MULTILAYER CERAMIC BAR PRINTING AND ASSEMBLING APPARATUS

BACKGROUND OF THE INVENTION

The present invention relates to a device for printing and assembling a plurality of ceramic sheets used to manufacture multilayer ceramic capacitors, and more particularly, to a printing device including an octagonal drum rotatable about a horizontal axis which functions as a transport mechanism to conduct ceramic sheets to the several stations at cardinal points arranged around the axis of rotation of the drum at which various process phases are performed.

Among the several known methods for producing multilayer capacitors is the method described in commonly owned U.S. Pat. No. 4,353,957. A plurality of thin leaves of finely divided ceramic composition are made by the use of a thermally-fugitive bonding material, for example, a resin or cellulose derivative, the ceramic composition being such as to form a dense dielectric layer when sintered. There is then applied to each of the leaves a matrix of images by applying a thin layer of what is commonly known in the art as "ink", a liquid or pasty composition which consists principally of a finely dispersed metal powder in a polymeric fluid. The images are produced by depositing the ink on the ceramic leaves, for example, by painting or screen printing procedures which are themselves well known to those skilled in the art.

The screened layers are smaller in surface area than the thin leaves to which they are applied, and each layer is of such a shape as to allow a margin of the associated leaf to extend around a major portion of the perimeter of the screened layer, while a portion of the latter extends to an edge of the leaf on which it is deposited. Preferably, the layers are equal in size.

A plurality of the leaves of the bonded ceramic composition are then stacked, with layers of ink intervening, and consolidated. The consolidation can be accomplished by means suitable to the particular materials employed, and may involve pressing, heating and/or the use of a solvent, all of which also are known to those skilled in the art. The leaves and intervening layers in the stack are so arranged that successive layers extend to different edge regions of the consolidated stack, but a major portion of the edges of each of the leaves is in contact with the edges of the adjacent leaves in the stack. The consolidated stack of leaves and intervening screened layers is then fired to remove the thermally-fugitive materials and to sinter the ceramic composition. There is thereby formed an integral, sintered, ceramic body having a plurality of thin sheets or strata of dense dielectric material, the sheets being joined at portions of their edges but being separated from one another over substantial portions of their adjacent surfaces and having between them thin cavities interrupted only by one or more distinct ceramic and/or metal pillars, substantially all of which, when there are a plurality, are separate.

Heretofore, the various phases in the manufacture of such multilayer ceramic capacitors, such as loading the ceramic leaves into a printing or screening mechanism, printing a layer of ink on the leaves, and stacking the plurality of inked leaves prior to consolidation, have been carried out at least in part manually and in part by several different apparatus. The obvious disadvantages of the known methods include the relatively large commitments of labor and of work space to accommodate the several apparatus, along with defective end products due to human and/or mechanical inaccuracies.

Accordingly, it is among the objects of the present invention to simplify the manufacture of multilayer ceramic capacitors by combining in a single apparatus operable by one person means for performing several of the process phases of their manufacture, thereby contributing to the simplification of the overall operation, minimizing the spatial requirements for apparatus, and reducing inaccuracies and defects in end product.

SUMMARY OF THE INVENTION

These and other objects of the present invention, as will become readily apparent to those skilled in the art, are accomplished by arranging the respective means for performing the various process phases in the manufacture of a multilayer capacitor at stations arranged at cardinal points around the horizontal rotational axis of an octagonal drum which serves as a transport mechanism to move the ceramic sheets to the various stations. Each of the process phases is thus performed by its corresponding means at a corresponding "flat" side of the octagonal drum. It will be understood that the device may be programmed to perform the various phases at the several stations simultaneously.

In a preferred embodiment of the present invention, two pins are provided in each of the eight drum flats or sides, one each near the axial ends of the drum. The pins cooperate with corresponding means provided on the screening and stacking apparatus, described below, to ensure the proper alignment of the electrode leaves for the respective screening and stacking functions. Each drum flat also is provided with a vacuum chuck comprising a group of holes centered between the pins. A vacuum distribution box is located on the bottom of each flat (i.e., within the drum interior), and is connected by hose to a rotary vacuum manifold concentric with the drum axle at one end of the drum.

Means are provided for automatically loading and unloading pallets into the stacking station to receive the printed sheets, including input and output conveyors and grippers. The exemplary embodiment can handle up to five pallets in a single cycle.

In practice, the loading function initiates the fabrication sequence on the machine, and is performed at Position #1 as the various positions are defined herein. A loading platform is located on an arm attached to a shaft arranged adjacent to the drum and parallel to the drum axis. The loading platform also has a vacuum chuck area similar to the drum vacuum chuck. Vacuum is controlled by a remote solenoid and is actuated after the ceramic sheet is in place. The platform is pivotable via the shaft between a first (horizontal) position at which the platform receives a ceramic sheet and a second (vertical) position in which the loading platform places the sheet into contact with the vacuum chuck area of the drum flat. When the shaft has been rotated to bring the sheet-bearing loading platform into contact with the drum flat, the drum vacuum turns on and the loading platform chuck switches from vacuum to pressure, thus transferring the ceramic sheet to the drum chuck. The alignment of the ceramic sheet to the drum flat at this station is not critical because the assembly of the printed sheets made in the machine is trimmed to dimension after the assembly is removed from the stacking station. That degree of alignment precision necessary at this stage is provided by a stationary alignment fence adjacent to the loading platform when the latter is in its first (horizontal) position.

The printing, or screening, station is located at the top of the machine at Position #3. The screening apparatus, the basic structure and function of which are themselves known in the art, is displaceable between a printing position (in which the screening apparatus contacts the alignment pins on the drum flat), an intermediate or normal position, at which the printing apparatus is parked between printing operations at a level high enough to clear the drum during the drum's rotation, and a raised position to permit access to the stainless-steel-mesh screen for cleaning purposes.

The stacking station is located below the drum at Position #7, and functions to receive the printed ceramic pieces from the drum and assemble them in a semifused, collated, registered stack on a pre-prepared tool steel pallet located in the station. The pallets are transported to and from that station, one at a time, by the aforementioned input and output conveyor and input and output grippers.

The printed pieces of ceramic sheet, as they leave the printing station held in place by the vacuum chuck on each drum flat, are precisely identical. The ceramic sheet is centered between the reference pins on the drum flat within a given tolerance, and the printed image on each sheet is located relative to the pins with a still finer degree of tolerance. As the drum rotates, successive ceramic sheets are loaded at Position #1, printed at Position #3 and appear above the stacking station at Position #7, upon which the steel pallet prepared with an adhesive upper surface is centered. The first piece of ceramic sheet of a given capacitor design being assembled is not printed as it passes the screening station because it is the outside cover sheet (unless the outside cover sheet is instead already placed on the pallet before loading). When this cover sheet arrives at the stacking station, alignment chucks engage the drum flat reference pins while in a similar manner chucks on the screening apparatus clamp the pins on the drum flat located at Position #3, thereby locating precisely the drum flat with reference to the stacking platform and steel pallet. The steel pallet, with its adhesive surface, is brought up into contact with the unprinted cover sheet on the bottom drum flat by operation of a pressure cylinder which raises the stacking platform on which the pallet is located, and the pressure to that drum flat vacuum chuck is then switched from vacuum to pressure. The ceramic sheet is thus positioned onto the steel pallet. Upon the next cycling of the machine a printed ceramic sheet will be over the stacking station, and the print will be transferred onto the cover sheet, adhering thereto because of the tacky surface of the freshly printed ink (as will subsequent sheets as they are cycled and applied).

Note, however, that successive layers of printed sheet are not stacked with their patterns directly overlying the preceding sheet, but are staggered in an alternating fashion, similar to the successive courses of bricks. This is accomplished by means located beneath the stacking station which jog the stacking platform back and forth by a programmed amount along the X-axis of the machine (i.e., right to left as viewed by an operator facing the machine). Once assembled, the stack of printed sheets are moved from the stacking station by the output gripper and output conveyor referred to above, and the stacks are then ready for subsequent treatment, e.g., consolidation, cutting and finishing.

BRIEF DESCRIPTION OF THE DRAWINGS

For a better understanding of the present invention, the scope of which is defined in the appended claims, reference is made to the following detailed description of a preferred embodiment thereof, taken in conjunction with the accompanying drawings, in which

FIG. 3 is a view of the pallet transfer mechanisms as seen from the input conveyor end;

FIG. 4 is a view of the pallet transfer mechanisms as seen from the output conveyor end;

FIGS. 5a through 5c are details of a drum flat of the octagonal drum;

FIG. 8 is a perspective view of the printing apparatus located at Position #3 above the octagonal drum;

FIG. 10 is a simplified perspective view of the octagonal drum seen from the side opposite the operator and showing the video inspection camera located at Position #5;

FIGS. 12a through 12d are schematic illustrations of the vacuum, pneumatic and pneumatic/hydraulic systems of the exemplary embodiment of the present invention.

DESCRIPTION OF EXEMPLARY EMBODIMENT

Figure 1:
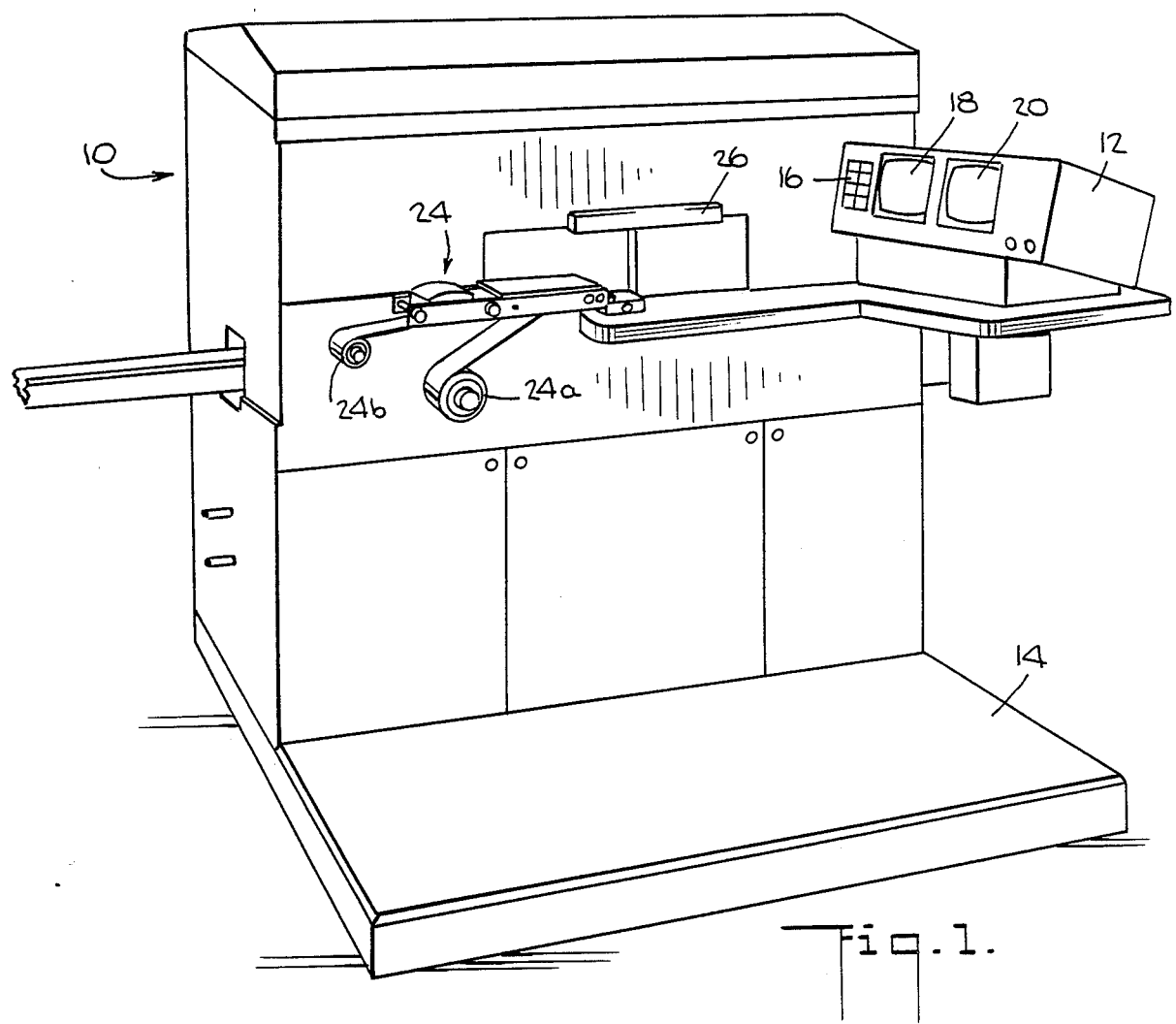
FIG. 1 is a perspective view of a printing device embodying the present invention.
Figure 11:
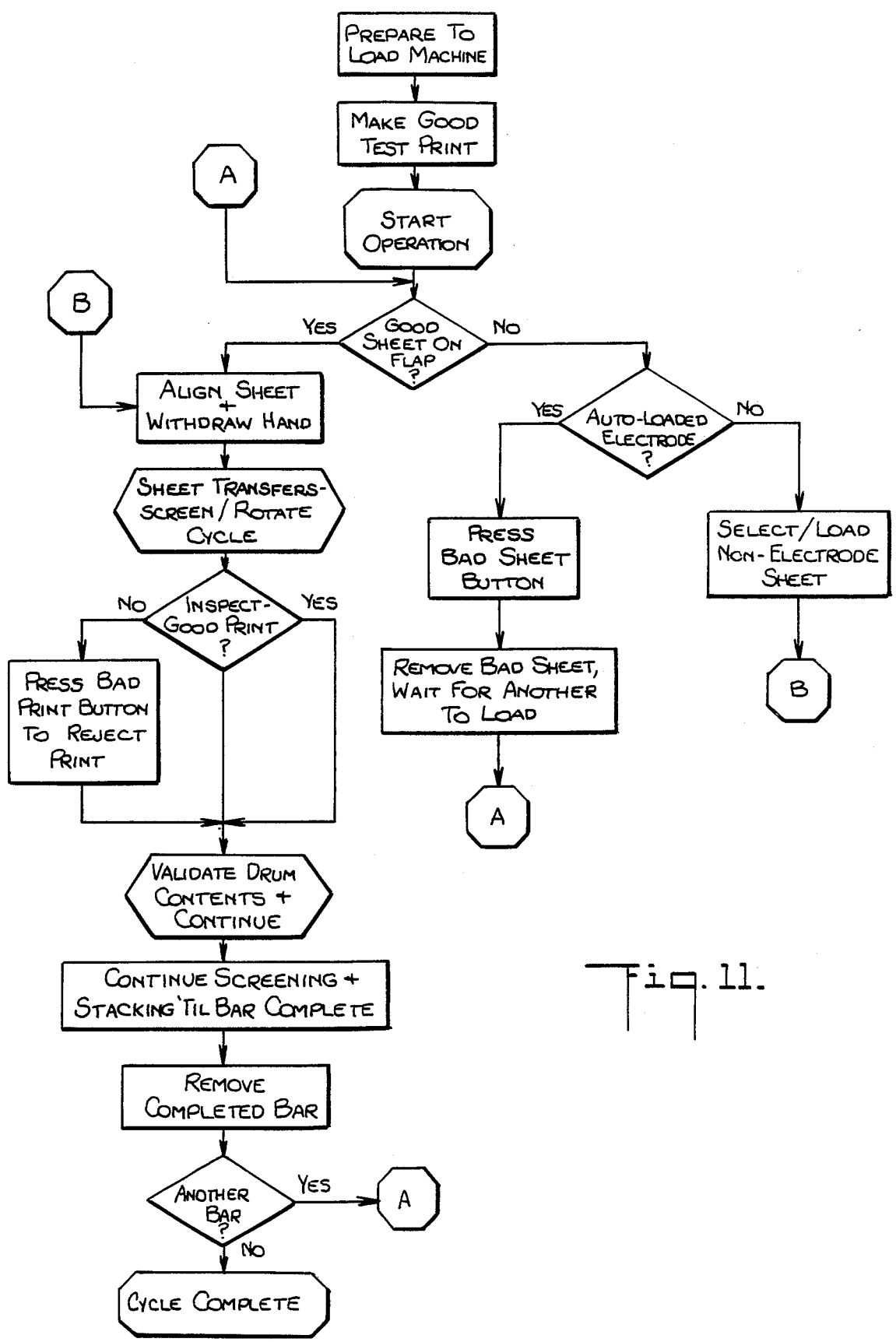
FIG. 11 is flow chart illustrating the operating logic of an exemplary embodiment of the present invention.
Figure 12A:
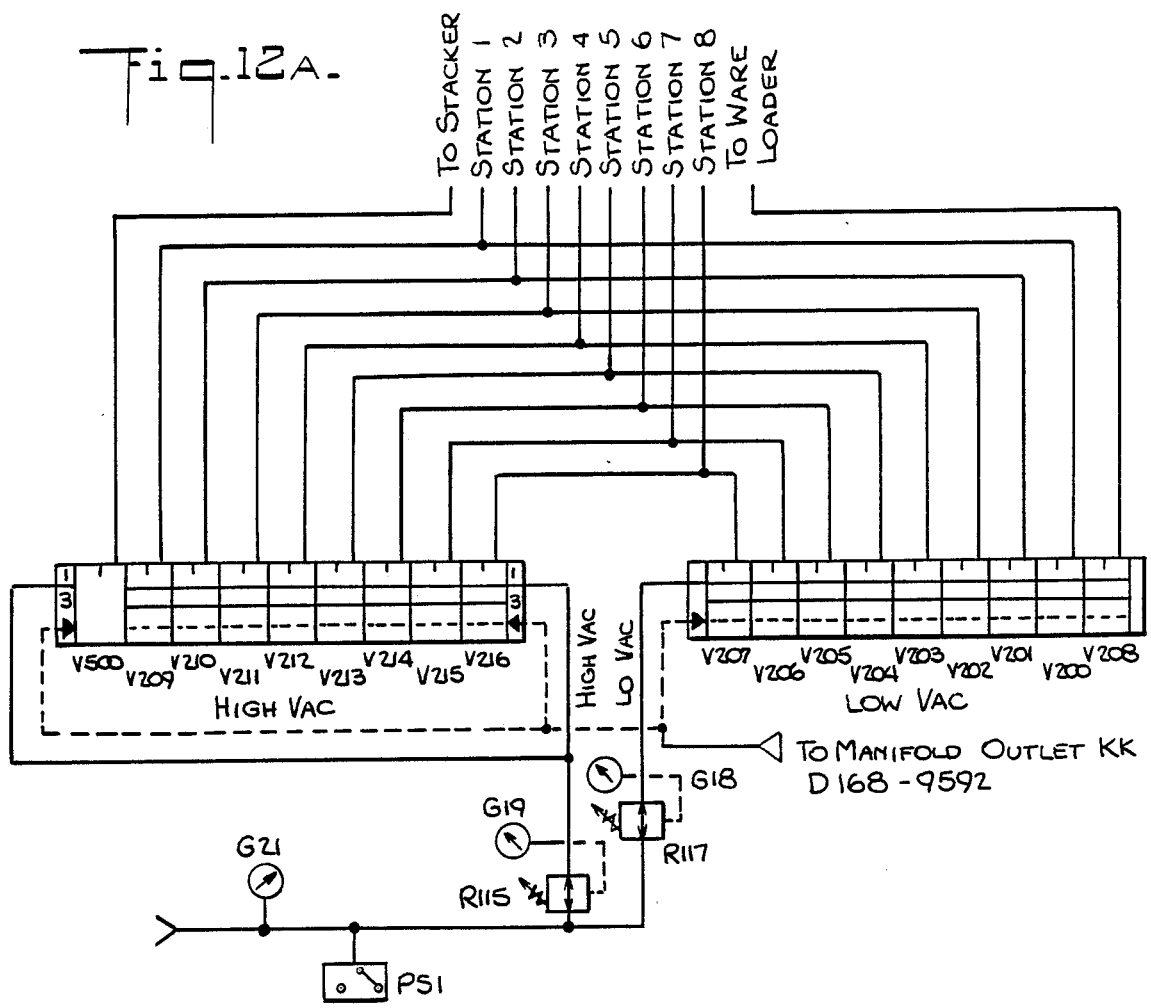
Figure 12B:
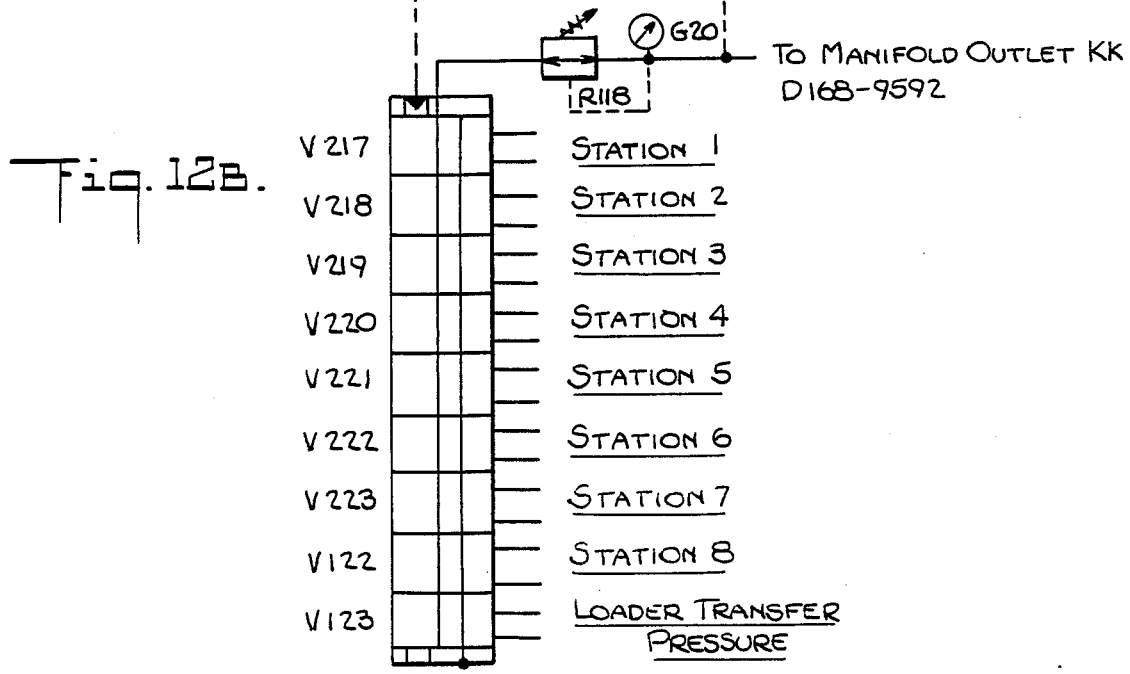
Figure 12D:
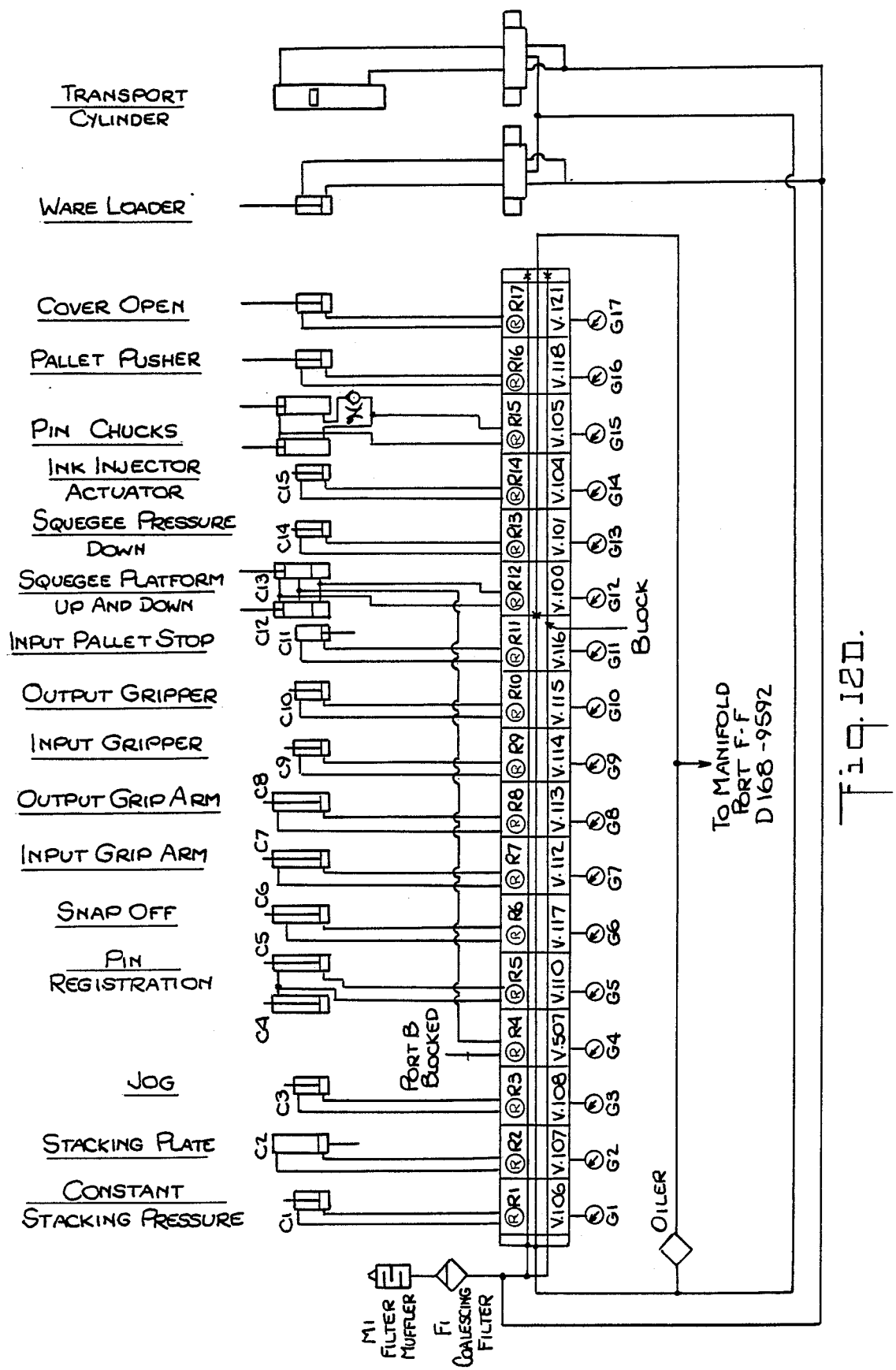

With reference to FIG. 1, there is shown a printing device 10 constructed in accordance with a preferred embodiment of the present invention. The device includes a control panel 12 located to the right of an operator as he or she stands on a platform 14 facing the device. The control panel 12 to the right includes a key pad 16 and two cathode ray tubes (CRTs) 18, 20. The operator enters commands on the keypad 16, working from visual prompts and a menu (i.e., a list of possible operating choices) displayed on the right-hand monitor 20 and generated by appropriate programming in the central processing unit of the device. The microprocessor-based electronics system of the exemplary embodiment comprises a commercially available Motorola M6809 CPU, and the industry-standard STD BUS card cage configuration, the construction and operation of which are known, and therefore, are not fully described herein. A flow diagram set forth in FIG. 11 illustrates the basic logic or program steps which will implement the operation of the exemplary embodiment of the present invention described herein.

The left-hand CRT 18 is a high resolution type monitor that displays an image of each screened layer to enable the operator to check visually for print quality when a screened sheet reaches Position #5, as will be described more fully below. A reject button on the control panel 12 can be employed to prevent defective layers if detected during the visual inspection from being stacked at the stacking station at Position #7, and thus be ejected when reaching the eject station at Position #8. The right-hand CRT 20 displays operational data (menus of operations from which the operator can select by entering commands on the keypad), the status of operations at the different stations and prompts to instruct or remind the operator as to different functions (e.g., to unload the output conveyor).

For example, the CPU generates a setup menu to enable the operator to program various process variables, such as desired squeegee speed, ink ejects and number of prints per eject, stacking pressure interval, heating phase interval, etc. In a preferred arrangement, this menu comprises three columns identifying the particular parameter, the current setting for each parameter and the units in which the numerical value is expressed. The CPU also generates a menu to enable the operator to program the desired bar design. The number of layers to be included in a bar, and which layers will comprise which sheet type, i.e., cover (top or bottom) electrode or center sheet, are programmed by the operator. A typical bar design might be:

| Layer # | Sheet Type |
| --- | --- |
| 1 | Top |
| 2-4 | Electrode |
| 5 | Center |
| 6-8 | Electrode |
| 9-11 | Bottom |

Figure 2:
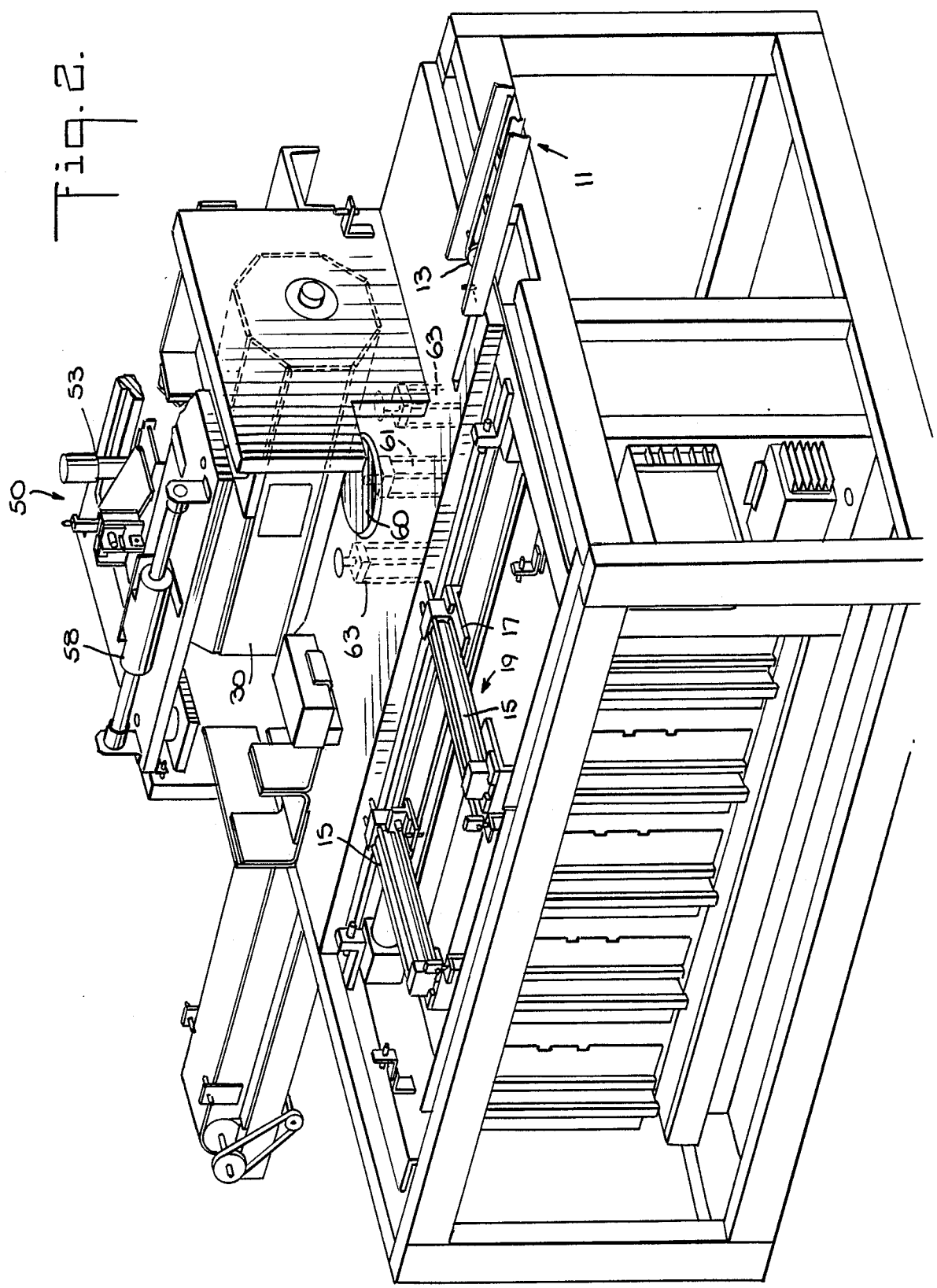
FIG. 2 is a perspective view from the opposite direction of the printing device of FIG. 1, with some parts broken away for clarity.

The exemplary embodiment of the device can accommodate five pallets (not illustrated) to prepare five ceramic bars automatically in a cycle, i.e., the ceramic bars are stacked on pallets which are moved to and from the stacking station located below the drum. With reference to FIGS. 2 and 3, the five pallets are loaded on a magazine (not illustrated) and inserted into an input station 11. The exposed face of each pallet is covered by a piece of adhesive-coated filter paper that extends about 0.125 in. beyond the outer dimensions of the sheet to be deposited. This adhesive paper provides a tacky surface to which the bottom cover sheet can adhere. Alternatively, the bottom sheet of the bar may be preapplied to the pallets, it being understood that the device will stack bar from bottom to top.

Figure 9:
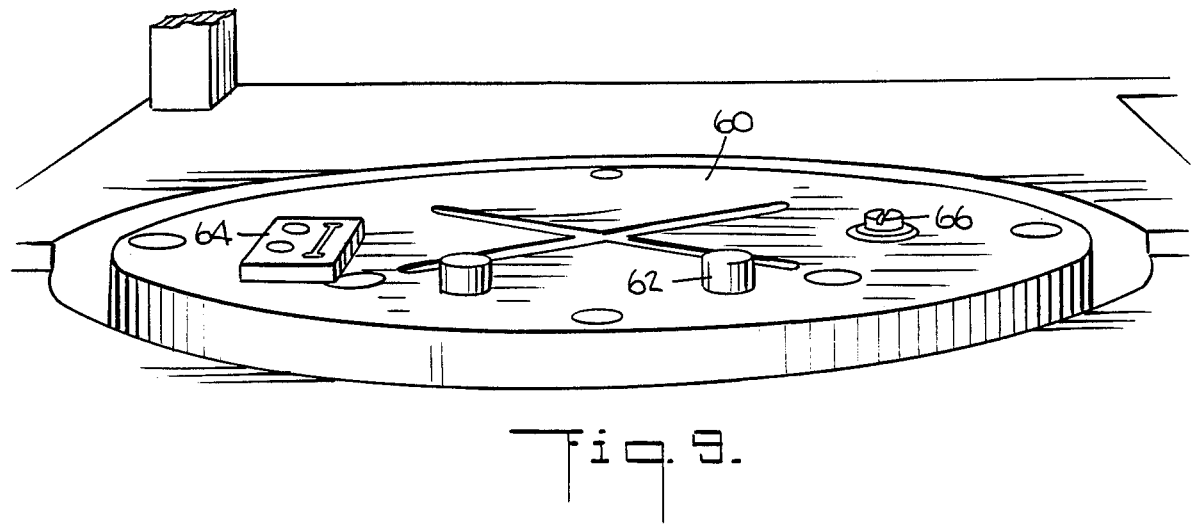
FIG. 9 is a view of the stacking platform at Position #7.

After an operator places a magazine into the input station 11, a motor driven input conveyor 13 moves the magazine into a loading position. Rails on the input conveyor 13 lift pallets free of the magazine. At the start of a printing cycle, or if the CPU determines that a completed bar is on the stacking platform 60 or otherwise indicates that a new pallet is needed on the stacking platform 60, a pallet load/unload assembly 19 is activated by the CPU. The load/unload assembly 19 comprises two cylinders 15 arranged parallel to each other on a carriage 17 which is movable along the X-axis of the device, (or generally left to right as viewed by an operator facing the device). Each cylinder 15 is provided with a spring-loaded finger. The right hand input cylinder pushes the pallet from the input conveyor 13 to a grip point at which an input gripper 21 grasps the pallet. The load/unload carriage 17 then is driven along the X-axis until the input gripper 21 is aligned at the stacking station, and the pallet is pushed onto the stacking platform 60 until it abuts two X-axis stop pin 62 (as seen in FIG. 9) on the platform 60. A retainer 64 on the left side of the stacking platform 60 forces the opposite end of the pallet against cam follower 66 to locate the pallet correctly along the Y-axis.

If a completed bar was already on the stacking platform 60, then at the same time the input gripper 21 captured a new pallet from the input conveyor 13, an output gripper 21' (FIG. 4) on the pallet load/unload assembly 19 would have retrieved the pallet bearing a completed bar from the stacking platform 60. While the carriage 17 displaces the load/unload assembly 19 along the X-axis of the machine so that the new pallet in the input gripper 21 is aligned with the stacking station, the just-completed bar on its pallet in the output gripper 21' is aligned with a load position for an output conveyor 23. The left-hand output cylinder 15 pushes the completed pallet onto the output conveyor 23 as the new pallet is pushed onto the stacking platform 60. A gear motor drives a single turn clutch that advances the output conveyor 23 approximately 5 in. with each turn. When the fifth pallet bearing a completed bar reaches a photosensor 22 near the end of the output conveyor 23, the operator receives a prompt on the right-hand CRT 20 of the control panel 12 to unload the conveyor 23. A new magazine with five new pallets can be loaded at the input station and the cycle then restarted.

As noted above, the operator stands in front of the machine on the platform 14, and in the exemplary embodiment is in front of an electrode sheet loader assembly 24 and a light curtain 26. The light curtain comprises several parallel beams of light directed downward and substantially vertically onto a row of sensors, and serves as a control switch the operator actuates by inserting or withdrawing a hand, i.e., breaking the light curtain will either start or stop machine functions as programmed into the CPU. Typically, the light curtain 26 is used in performing automatic processing functions already programmed, while the keypad is used to select or program functions from the menu as discussed above.

The electrode sheet loader 24, located to the left of the operator when facing the device, automatically dispenses and cuts electrode sheet from a supply reel 24a. Cut electrode sheets then drop onto a loading platform (FIGS. 7(a) and 7(b) discussed below) in front of the operator while the carrier film advances to a discard reel 24b.

Figure 6A:
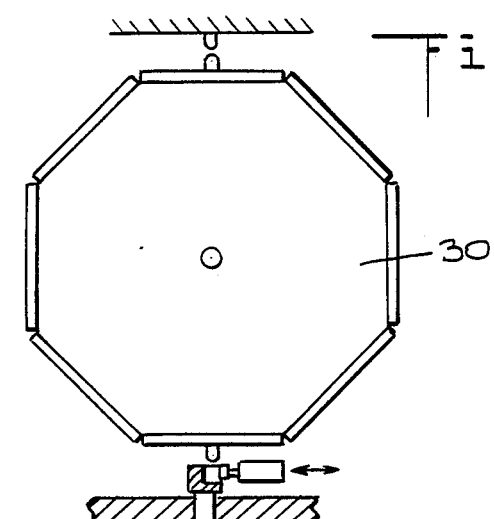
FIGS. 6a through 6f are details of the alignment pins provided on the drum flats and the cooperating chucks, and in particular those of the printing station.
Figure 6B:
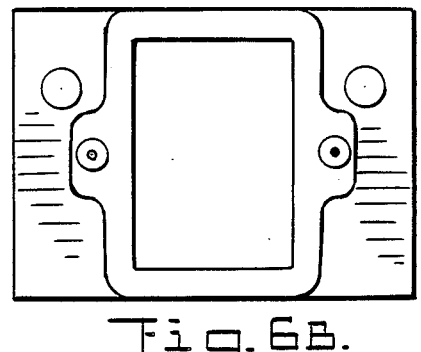

In accordance with the present invention, the process phases in the manufacture of the multilayer ceramic bars are accomplished using an octagonal drum 30, seen most clearly in FIGS. 2, 6a and 10, to transport the ceramic sheets to the various apparatus for performing the respective manufacturing phases. The drum 30 advances each ceramic sheet through all the necessary processing phases as a stepper motor rotates the drum 30 into each of the positions about the rotational axis of the drum 30 as follows:

| | 3. PRINT | |
| --- | --- | --- |
| DRYING (ALTERNATE) 4. | | 2. VERIFY LOADED |
| PRINT VERIFY (VIDEO) 5. | | 1. LOAD SHEET |
| DRYING (PRIMARY) 6. | | 8. REJECT |
| | 7. STACK | |

A drum drive mechanism rotates the drum 45~±0.01~in each rotation cycle, and appropriate acceleration and deceleration means are used to provide smooth movement of 1 sec. duration between rest positions.

With reference now to FIGS. 5a–5c, each side of the drum 30 comprises a drum flat 32 having a vacuum chuck 34 therein with ports connected to separate vacuum and positive pressure (air) lines 36 supplied from a bank of valves through a separate manifold for each position. The arrangement of the vacuum and pressure valves and connections is illustrated schematically in FIGS. 12(a) through 12(d), which will be readily understood by those skilled in the art. Each vacuum chuck 34 comprises a group of 0.020" holes, centered between two reference pins 38 described more fully below. A vacuum distribution box 35 is located on the bottom of each drum flat 32 (i.e., within the interior of the drum 30), and is connected to a rotary vacuum manifold (not illustrated) concentric with the drum axle at one end of the drum 30.

As mentioned above, and with reference to FIGS. 5a–5c and 6(a)–6(f), each drum flat 32 is provided with two pins 38 located one each near the axial ends of the drum 30. The pins 38 cooperate with corresponding two-part alignment chucks 37, 37a and pins arranged on the screening apparatus (FIGS. 6(c)–6(d)) to ensure the proper alignment of the ceramic sheet for the screening function. A substantially similar chuck arrangement is provided at the stacking station. The pins 38 are accurately located on the drum flats 32 so that a line passing through the pin centers of opposite flats 32 on the drum 30 (FIG. 6(a)) pass within 0.002" of the drum axis of rotation when at the center of a ±0.010" compliance.

Figure 6C:
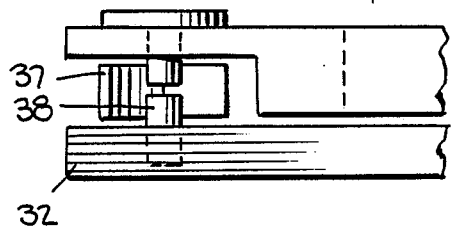
Figure 6E:
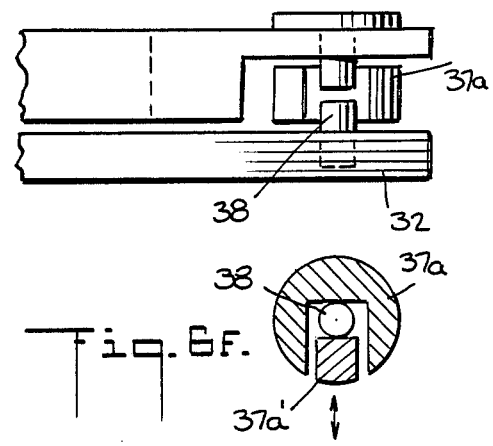
Figure 6D:
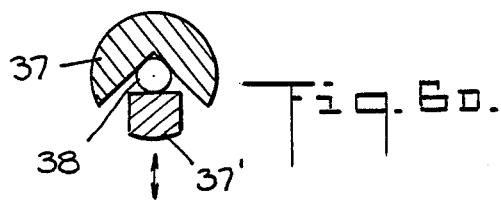
Figure 6F:
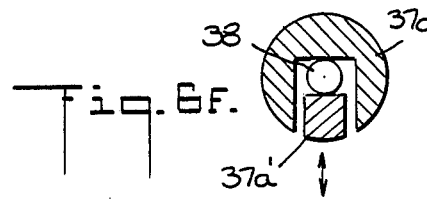

Each of the drum flats 32 is fastened to the body proper of the drum 30 with compliant fasteners to allow a ±0.010" movement of each drum flat 32 in the X-Y plane of the flat, pins and vacuum chuck assembly. This allows the pin chucks 37 and 37a to jog a particular drum flat 32 into precise alignment with each of the printing and stacking stations independent of the functions being performed at the other drum flats 32 located at the other stations. As best seen in FIGS. 6(c) and 6(e), this jogging results from the use of two different chuck designs. One of the pin-receiving chucks 37 of the printing stations is a three-point-type chuck which acts to lock the pin, and thus that end of the particular drum flat 32, in a fixed manner (FIG. 6(c)). After the screening platform had lowered and the drum flat pin 38 is within the cut-out of the chuck 37, an armature member 37', displaceable in the direction indicated by the arrow in FIG. 6(d), locks the pin 38 within the chuck. The other pin-receiving chuck 37a is squared (FIG. 6(e)) to permit that minor degree of movement required to jog the drum flat 32 into position enabled by the compliant fasteners holding the drum flat 32 to the drum body proper, and its armature member 37a' similarly locks the pin 38 therewithin. The chucks are located at the screening and stacking stations with sufficient accuracy to place them within a circular error limit of 0.010" over the reference pins 38 on the drum flats 32. The simultaneous gripping of the pins at the screening and stacking stations will repeat position the screen image relative to the drum flat center with a circular error less than 0.002".

Although the eight positions at which the process phases are performed are described separately below, it will be understood that the phases at each station can, and preferably are, performed simultaneously (assuming that all operating conditions are met) with the use of appropriate programming for the CPU, the basic logic of which is illustrated in FIG. 11 as noted above.

Position #1—Load sheet

In practice, the loading function initiates the fabrication sequence of the machine once a magazine of pallets has been loaded and a first pallet installed on the stacking platform 60 as described above.

Figure 7A:
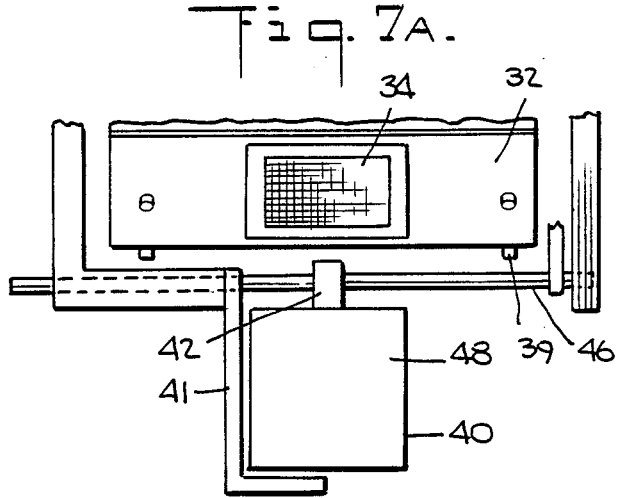
FIGS. 7a and 7b are simplified partial plan and side views, respectively, of the loading platform in its first (horizontal) position.
Figure 7B:
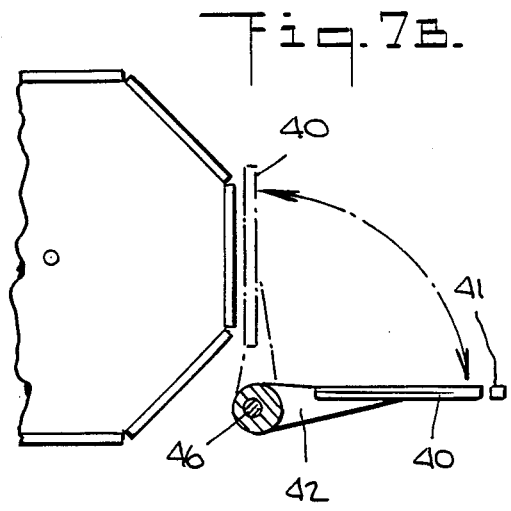

With reference to FIGS. 7(a) and 7(b), a a loading platform 40 is located on an arm 42, which in turn is attached to a shaft 46 arranged adjacent to the drum 30 and parallel to the axis of rotation of the drum 30. The loading platform 40 is pivotable via the shaft 46 and a drive motor (not illustrated) between a first, horizontal position, illustrated in solid lines in FIG. 7(b), at which the platform receives a ceramic sheet from the sheet loader 24 and a second, vertical position, illustrated in broken lines in FIG. 7(b), at which the loading platform 40 brings the sheet into contact with the vacuum chuck 34 of the drum flat 32 located at Position #1. The loading platform 40 has a vacuum chuck 48 similar to the drum vacuum chuck 34 (controlled by a remote solenoid), and is actuated after the ceramic sheet is in place on the loading platform vacuum chuck 48. When the shaft 46 has been rotated to bring the sheet-bearing loading platform 40 into contact with the drum flat 32, the vacuum supply to that particular drum vacuum chuck 34 is actuated and the loading platform vacuum chuck 48 is switched from vacuum to pressure, thus transferring the ceramic sheet from the loading platform vacuum chuck 48 to the drum vacuum chuck 34.

The alignment of the ceramic sheet to the drum flat chucks 34 at this station is not critical because the assembly of the printed sheets made in the machine is subsequently trimmed to dimension after removal from the stacking station. For example, for a 4"×4" image size, the ceramic sheet fed to the device would be ⅛" oversize (4⅛"×4⅛"). The less-than-critical degree of alignment precision necessary at this stage is provided by a stationary alignment fence 41 located adjacent to the loading platform 40 when the latter is in its horizontal position, and is used by the operator as a guide to position the sheet on the loading platform 40 within a ±0.025" tolerance, well within the scrap area provided for the sheet.

Position #2—Verify Loaded

After the drum 30 indexes one position, a sensor 43 (FIG. 8) verifies that sheet is loaded on the drum vacuum chuck 34 of the particular drum flat 32 located at this station. If no sheet is loaded onto the drum flat 32, the supply of vacuum to that drum flat 32 is terminated, and that drum flat 32 will not be screened when it reaches Position #3.

Position #3—Printing

In this position places the ceramic sheet is located beneath the screening apparatus 50 arranged above the drum 30. The drum flat 34 in this position is supplied with a higher vacuum pressure than at other positions to hold the ceramic sheet securely in place during screening, and later to avoid drawing the ink, once applied, through the ceramic sheet.

With reference to FIGS. 2 and 8, the screening apparatus 50 comprises four major assemblies: the squeegee arm 52, the screening platform 54, the squeegee blade holder 56 and the drive cylinder 58. The apparatus and procedure for performing the screening operation are themselves basically known to those skilled in the art. An appropriate stainless-steel-mesh screen is installed in the screening platform 54 using the screen clamps 51 located on the screening platform 54, and the squeegee blade carried by the blade holder 56 is mounted onto the end of the squeegee arm 52. Ink is supplied from an ink well 53, and as noted above, the frequency of ink ejections from the well 53 and the movement of the squeegee arm 52 are controlled by the CPU. The squeegee arm 52 is driven by the drive cylinder 58 to drag the squeegee blade across the screen at a desired controlled rate. The drive cylinder 58 is a commercially available device equipped with proximity sensors to provide a signal indicative of the rate of its stroke to the CPU, i.e., the proximity sensors detect the travel of the drive cylinder 58, and the CPU uses these signals to calculate travel rate. The travel rate may vary from about 125mm/sec. to about 500 mm/sec. (approximately 5 in./sec. to 20 in./sec.), and is sensed on one pass and adjusted for on the next pass.

The screening platform 54 is preferably adjustable, for example by means of pneumatic cylinders 57, into three positions: raised, screening and normal. The raised position displaces the platform high enough to permit access to the screen for cleaning purposes. The screening position is the lowermost position, and is the position at which the screen rests on the drum vacuum chuck 34 to screen the ceramic sheet disposed on the particular drum flat 34 located at Position #3. The normal, or intermediate, position is the rest position at which the screen resides between screening operations at a height sufficient to clear the drum 30 during its rotation.

As noted above, the ceramic sheet is centered between the reference pins 38 wihtin a ±0.025 tolerance. The printed image on the sheet, however, is located relative to the pins 38 with less than ±0.0005" tolerance because of the accuracy of the pin chucks 37, 37a in locating the screening platform relative to the drum flat 32.

Position 4—Drying

Although not employed in the exemplary embodiment of the present invention described herein, a drying means, such as an infrared device, may be used at this station.

Position 5—Print Verify Video

With reference to FIG. 10, a video camera 55 mounted on the rear of the device provides the operator with a closed circuit television image of each print made at Position #3 to enable the operator to verify the printing operation and to evaluate print quality. The image is displayed on the high-resolution CRT 18 on the left side of the control panel 12 referred to above (i.e., the first CRT to the right of the operator as he or she faces the device). If a print is unacceptable, a reject button may be employed to prevent the ceramic sheet on that particular drum flat from being stacked at Position #7, and instead to be retained on the drum flat 34 and be moved along to the reject station at Position #8.

Position #6—Dry

In the exemplary embodiment a commercially available infrared heat source is used at this position. The infrared heater drives off solvents from the electrode ink which must be removed before stacking the sheets at Position #7. The duration of heating can be adjusted by the operator as required, but in any event is so selected to leave the ink slightly tacky to aid in stacking at the next station.

Position #7—Stacking

With reference to FIGS. 2 and 9, when a ceramic sheet is positioned at the stacking position, the stacking platform 60 having a steel pallet positioned thereon as described above, is raised into proximity with the drum flat 32 at this position by operation of a stack pressure cylinder 61. The cylinder 61 applies a predetermined, operator-selected amount of pressure for a preselected time, which causes the still-tacky inked surface of the sheet to bond to the pallet located on the stacking platform 60.

Before the stacking platform 60 is raised, however, two registration cylinders 63 located on either side of the vertical stacking pressure cylinder 61 are raised. These registration cylinders 63 carry chucks, substantially similar to the chucks arranged on the screening station, to engage the pins 38 on the drum flat 32 and to pull the drum flat 32 into the same registration with the stacking station as it had with the screening station at Position #3, as described above.

Upon the next cycling of the drum 30 at which point a new printed ceramic sheet will be over the stacking station, to achieve an alternating or brick-type layering of subsequent sheets, a jog assembly is used to offset each layer of sheet to the left or right a predetermined distance from adjoining layers. A pneumatic cylinder located beneath the stacking platform 60 drives the stacking platform 60 back and forth along ways on the X-axis. The distance traveled is selected by adjusting center left and center right micrometers to the total desired offset.

Position #8—Reject

When a layer is rejected by the operator after inspection at Position #5, the layer is not stacked at Position #7 and instead reaches this position. The supply of vacuum to that particular drum flat vacuum chuck 34 is switched to positive pressure to blow the sheet off of the drum flat 32 and into a reject drawer located immediately below the sheet loading platform 40 for subsequent disposal.

While the present invention has been described with reference to an exemplary embodiment thereof, it will be appreciated by those skilled in the art that variations and modifications may be made thereto without departing from the spirit of the inventive concepts disclosed herein. For example, the invention should not be viewed as limited to an octagonal transport drum, but may be any appropriately configured polygonal drum about which various process phases in the manufacture of an article may be arranged sequentially. All such variations and modifications are intended to fall within the scope of the appended claims.

I claim:

1. A device for the printing and assembling of a plurality of ceramic sheets used in the manufacture of multilayer ceramic capacitors and the like comprising a rotatable transport means for moving ceramic sheet to various means for performing various respective processing phases performed by said device, wherein said transport means comprises a multi-sided drum rotatable abut a horizontal rotational axis, wherein each side of said drum comprises a drum flat having alignment pins projecting therefrom, a loading means for loading ceramic sheet onto said transport means, a ceramic sheet supply means for dispensing ceramic sheet to said loading platform, a screening means for applying a layer of ink onto said ceramic sheet, said screening means including a frame having alignment pins projecting therefrom, a stacking means for assembling a plurality of said ceramic sheets after screening by said screening means, said stacking means including a stacking platform having alignment pins projecting therefrom, means for precisely aligning said alignment pins of said screening means and said stacking means relative to the alignment pins of said transport means, means for installing a pallet onto said stacking means on which said plurality of ceramic sheets is assembled, means for moving said pallets from said stacking means after said plurality of ceramic sheets has been assembled, and control means including a central processing unit.

2. The printing and assembling device according to claim 1, wherein said screening means and said stacking means are located at cardinal points about said horizontal rotational axis.

3. The printing and assembling device according to claim 2, further comprising means for supplying vacuum and pressure to said drum and said loading means.

4. The printing and assembling device according to claim 3, wherein each of said drum flats secured thereto by compliant means to permit limited movement of said flat relative to said drum.

5. The printing and assembling device according to claim 4, wherein said means for supplying vacuum and pressure comprises means to supply said vacuum and pressure individually and selectively to each of said drum flats and said loading means.

6. The printing and assembling device according to claim 5, wherein said screening means and said stacking means include chuck means for engaging said alignment pin means on said drum flats to align said alignment pins of said drum flats relative to said alignment pins of said screening means and said stacking means.

7. The printing and assembling device according to claim 6, wherein one of said chucks on each of said screening means and said stacking means comprises a three-point chuck.

* * * * *